US006933725B2

(12) United States Patent
Lim et al.

(10) Patent No.: US 6,933,725 B2
(45) Date of Patent: Aug. 23, 2005

(54) NMR PROBE CIRCUIT FOR GENERATING CLOSE FREQUENCY RESONANCES

(75) Inventors: Yit Aun Lim, Chelmsford, MA (US); Werner E. Maas, Boxford, MA (US)

(73) Assignee: Bruker Biospin Corporation, Billerica, MA (US)

( * ) Notice: Subject to any disclaimer, the term of this patent is extended or adjusted under 35 U.S.C. 154(b) by 1 day.

(21) Appl. No.: 10/758,810

(22) Filed: Jan. 16, 2004

(65) Prior Publication Data

US 2005/0156597 A1    Jul. 21, 2005

(51) Int. Cl.[7] ............................................... G01V 3/00
(52) U.S. Cl. ..................................... 324/322; 324/318
(58) Field of Search .............................. 324/322, 318, 324/314, 312, 300, 306, 307, 309, 321

(56) References Cited

U.S. PATENT DOCUMENTS

| | | | |
|---|---|---|---|
| 4,833,412 A * | 5/1989 | Zens | 324/322 |
| 5,166,621 A * | 11/1992 | Codrington et al. | 324/322 |
| 5,243,289 A * | 9/1993 | Blum et al. | 324/322 |
| 5,424,645 A * | 6/1995 | Doty | 324/318 |
| 6,686,741 B2 * | 2/2004 | Hasegawa | 324/322 |

* cited by examiner

Primary Examiner—Louis Arana
(74) Attorney, Agent, or Firm—Kudirka & Jobse, LLP

(57) ABSTRACT

A circuit for a nuclear magnetic resonance probe uses three resonators to create resonances intermediate to the resonator resonant frequencies. The circuit is particularly useful for creating magnetic fields for two closely spaced high frequencies, such as those used for the excitation of $^1$H and $^{19}$F. The resonators are arranged in a parallel combination, or the electrical equivalent thereof, with input ports connected to it for inputting the desired high frequency resonances. Admittance inverters may be used to provide isolation between the input ports. Some of the resonators and the admittance inverters may be transmission lines. The transmission lines may have additional ports for additional input signals of lower frequencies located at null points for the frequencies of the signals coupled to the primary input ports. Adjustable dielectric components in the resonator transmission lines may be used for tuning purposes.

37 Claims, 3 Drawing Sheets

US 6,933,725 B2

NMR PROBE CIRCUIT FOR GENERATING CLOSE FREQUENCY RESONANCES

FIELD OF THE INVENTION

This invention relates generally to the field of nuclear magnetic resonance (NMR) spectroscopy and, more particularly, to an NMR probe circuit having multiple simultaneous resonances.

BACKGROUND OF THE INVENTION

In the field of NMR spectroscopy, a sample is surrounded by an NMR probe that consists of a radio frequency (RF) coil tuned to generate a field at a desired excitation frequency and receive a return NMR signal. More complex probes will generate multiple frequencies so as to excite the nuclei of more than one different element in the sample (e.g., hydrogen nuclei $^1$H (proton) and fluorine nuclei $^{19}$F). These "double resonance" probes (in the case of a probe generating two separate frequencies) and "triple resonance" probes (in the case of a probe generating three separate frequencies) have been used for many years, with varying degrees of success. One of the problems faced by multiple resonance probes arises when two of the "resonances" are closely spaced in frequency. For two resonances that have a relatively wide frequency separation (such as $^1$H and $^{13}$C), it is fairly easy to isolate the two frequencies in the generation circuit. However, for elements having resonant frequencies closer together (such as $^1$H and $^{19}$F), it becomes more difficult to get good frequency discrimination between them.

In systems having a single sample coil, it is necessary to generate each desired resonant frequencies and apply them to the coil, so the frequency isolation must come from the circuits themselves. Different approaches have been used to try to better isolate resonances that are close in frequency. In U.S. Pat. No. 6,307,371, a design is used for close, high frequency resonances that has come to be known as "overcoupling." In this design, a sample coil is provided that has electrically coupled to one side circuitry associated with lower frequency channels. The circuit for two high frequency channels is connected to the other side of the sample coil, and consists of a single section of transmission line with an inductor at a position along its length that results in the formation of two inductively coupled quarter-wavelength ($\lambda/4$) resonators, each of which is tuned to a different one of the high frequencies. The inductor is typically made adjustable, along with a trimmer at one end of the transmission line, so that the two resonant halves may be precisely tuned. Although this design successfully applies both high resonant frequencies to the sample coil, it is inherently unbalanced, in that the peak of the magnetic field distribution is not in the center of the sample coil for both the high frequency and the low frequency resonances. In addition, the circuit necessary to support this design, if made small enough to fit within the standard-sized bore of a NMR magnet, would be relatively inefficient.

Another "overcoupled" circuit is shown in U.S. Pat. No. 4,742,304. In this arrangement, the resonance of a sample coil tank circuit (consisting of the sample coil and a first capacitance) is split into two closely-spaced frequencies by coupling it to a second, "dummy" tank circuit. While this circuit can be effective for lower frequencies, it does not achieve the necessary separation between resonances at higher frequencies (i.e., above 400 Mhz).

In U.S. Pat. No. 5,861,748, a double resonance circuit uses a highly branched assembly of coaxial transmission lines of different lengths and different branch points having each distinct matching elements for the various measuring frequencies. However, in this design, all of the channels are on the same side of the sample coil, making the circuit inherently unbalanced. In addition, the circuit is physically very large, making it difficult to fit in a standard bore.

In *Methods for the Analysis and Design of a Solid State Magnetic Resonance Probe*, Review of Scientific Instruments 69(9) 1998, the authors describe a probe for use with multiple resonances, including the closely spaced resonant frequencies for $^1$H and $^{19}$F. The probe circuit makes use of transmission lines and capacitors to form the desired nodes, and to provide a probe circuit with higher efficiencies than previously achieved. However, the probe requires a high number of transmission lines very strategically placed around the sample coil.

SUMMARY OF THE INVENTION

In accordance with the present invention, a probe circuit for an NMR probe is provided that enables the probe to handle simultaneous resonant frequencies while maintaining good balance and isolation. The probe circuit is especially suited for simultaneous high frequency resonances (e.g., over 400 MHz) that are spaced within 20% of each other in frequency, and particularly for very closely spaced resonances, e.g., within 10% of each other in frequency. The probe circuit uses a plurality of resonators to give rise to intermediate resonances at the desired resonant frequencies. In particular, three resonators may be used to create two intermediate resonances. A first resonator may be resonant at frequency $f_1$, a second resonator resonant at frequency $f_2$, higher than $f_1$, and a third resonator resonant at frequency $f_3$, higher than $f_2$. The second resonator may have a magnetic field generating component that generates the desired magnetic fields for the probe, and detects the return NMR signal. The frequency relationship of $f_1$, $f_2$ and $f_3$ are such that intermediate resonances $f_{12}$, between $f_1$ and $f_2$, and $f_{23}$, between $f_2$ and $f_3$ are established. As such, when signals at the desired resonant frequencies, $f_{12}$ and $f_{23}$ are coupled into the circuit, the circuit resonates at $f_{12}$ and $f_{23}$ such that magnetic fields are generated by the magnetic field generating element at $f_{12}$ and $f_{23}$.

In the invention, the multiple resonators may be arranged electrically in a parallel combination, or in a combination that is the electrical equivalent of a parallel combination. For example, with three resonators, the second resonator may be separated from the first resonator and third resonator by admittance inverters, one to either electrical side of the second resonator. In this way, the first input port, which is electrically connected to the first resonator, may have a degree of electrical isolation from the second input port, which is electrically connected to the third resonator. In such a configuration, a first signal at $f_{12}$ would be input at the first input port, and a second signal at $f_{23}$ would be input at the second input port.

In one embodiment of the invention, transmission lines are used for the first and third resonators. The transmission lines may be configured as quarter wavelength resonators that are resonant at the respective frequencies $f_1$ and $f_3$. The second resonator may be configured as a parallel capacitor/inductor combination, with a sample coil serving as the inductor. Transmission lines may also be used for the admittance inverters, and may be configured as quarter wavelength resonators that are resonant at a frequency $f_k$ that is preferably intermediate to $f_1$ and $f_3$, for example $f_k = f_2$. The transmission line used as the first resonator has null points for frequencies $f_{12}$ and $f_{23}$ that are in very close proximity to each other. A third input port may be connected to the first resonator transmission line in the vicinity of the null points, allowing a third frequency $f_x$ to be input at that point. Similarly, a third (or possibly fourth) input port may be connected to the second admittance inverter transmission line at the null points for $f_{12}$ and $f_{23}$. Either or both of these additional ports may be used to introduce additional frequencies for which magnetic fields are generated by the magnetic field generating component.

BRIEF DESCRIPTION OF THE DRAWINGS

The above and further advantages of the invention may be better understood by referring to the following description in conjunction with the accompanying drawings in which.

DETAILED DESCRIPTION

Figure 1:
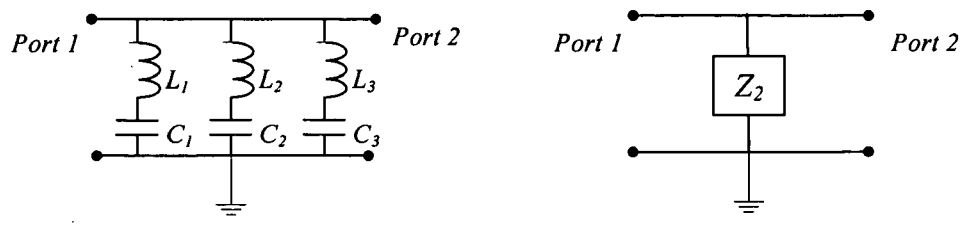
FIG. 1 is a schematic view of a circuit configuration on which the present invention is based.

FIG. 1 shows a schematic depiction of a circuit having three parallel resonators $L_1C_1$, $L_2C_2$ and $L_3C_3$, which together may be represented as a total shunt impedance $Z_2$. Mathematically, $Z_2$ can be represented by the expression:

$$Z_2 = \frac{j(\omega^2 L_1 C_1 - 1)(\omega^2 L_2 C_2 - 1)(\omega^2 L_3 C_3 - 1)}{\omega(a\omega^4 + b\omega^2 + c)}$$

where;

$a = C_1 C_2 C_3 (L_1 L_2 + L_2 L_3 + L_3 L_1)$ $b = -(L_1 C_1 C_2 + L_1 C_1 C_3 + L_2 C_2 C_1 + L_2 C_2 C_3 + L_3 C_3 C_1 + L_3 C_3 C_2)$ $c = C_1 + C_2 + C_3$

From this, it may be seen that there are three transmission zeroes that occur, respectively, at:

$$f_1 = \frac{1}{2\pi \sqrt{L_1 C_1}}, f_2 = \frac{1}{2\pi \sqrt{L_2 C_2}}, f_3 = \frac{1}{2\pi \sqrt{L_3 C_3}} \quad (5)$$

Meanwhile, three transmission poles occur, one at DC and the others at:

$$f_{12}, f_{23} = \sqrt{\frac{-b \pm \sqrt{b^2 - 4ac}}{8\pi^2 a}} \quad (6)$$

Figure 2:
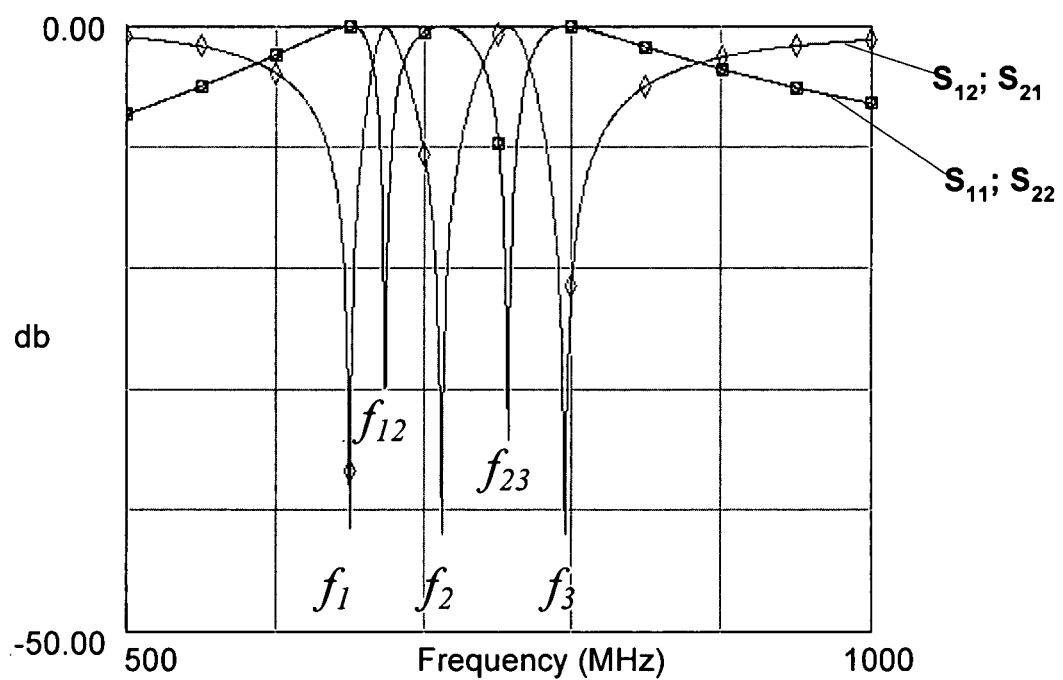
FIG. 2 is a graphical depiction of the relative resonant frequencies of the circuit of FIG. 1.
Figure 3:
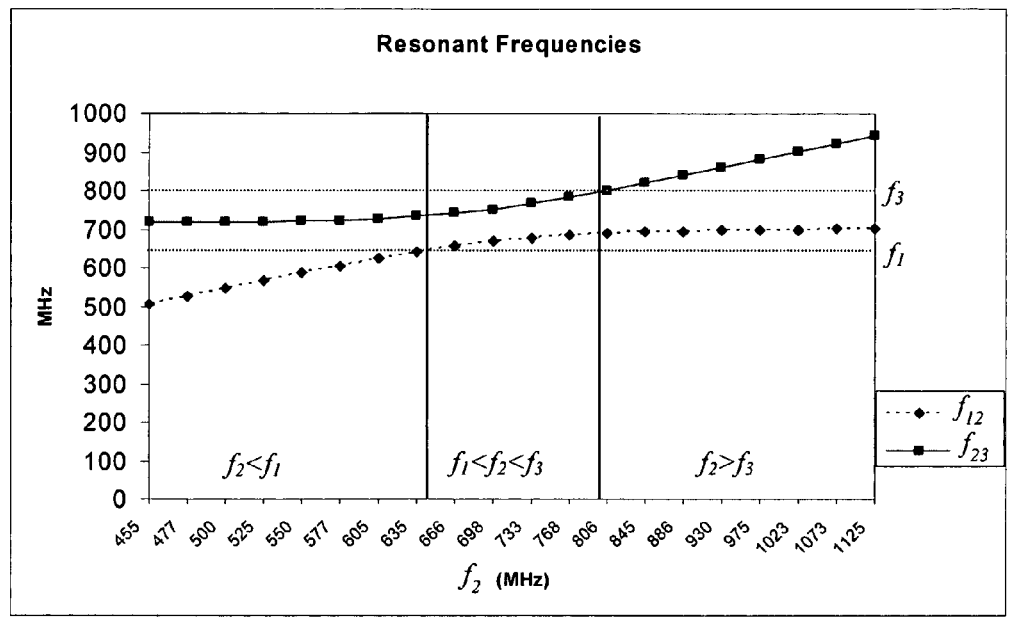
FIG. 3 is a graphical depiction of how intermediate frequencies $f_{12}$ and $f_{23}$ change with changes to resonant frequency $f_2$.

Thus, the simulated resonances for this circuit may be plotted as shown in FIG. 2. In this figure, a first plot shows the frequency response as would be detected at Port 1 of the circuit in FIG. 1 when a signal is injected at Port 2 ($S_{12}$), or as would be detected at Port 2 when a signal is injected at Port 1 ($S_{21}$). The second plot shows the frequency response that would be detected at Port 1 of the circuit in FIG. 1 if when a signal is injected in Port 1 ($S_{11}$), or what would be detected at Port 2 when a signal is injected into Port 2 ($S_{22}$). As shown, the transmission poles $f_{12}$ and $f_{23}$ are intermediate in frequency, respectively, to the transmission zeroes $f_1$ and $f_2$, and $f_2$ and $f_3$. In this configuration, there is a certain variance in the transmission poles as changes are made in the zeroes. As an example, FIG. 3 shows the changes in $f_{12}$ and $f_{23}$, respectively, as $f_2$ is changed, and $f_1$ and $f_3$ are kept constant. As shown, there are certain dependencies of the transmission poles on the change in $f_2$. These dependencies may be best viewed relative to three different frequency ranges, namely, when $f_2<f_1$, when $f_1<f_2<f_3$ and when $f_2>f_3$. These ranges are shown as separate sections in the diagram of FIG. 3.

In the first section of FIG. 3, where $f_2<f_1$, $f_{12}$ has a high degree of dependency on $f_2$, while $f_{23}$ remains fairly constant. As $f_2$ increases into the range in which $f_1<f_2<f_3$, the change in $f_2$ has a noticeable, and approximately equal, effect on both $f_{12}$ and $f_{23}$. Finally, as $f_2$ is increased through the range in which $f_2>f_3$, the effect of its frequency change on $f_{12}$ becomes very small, while the effect on $f_{23}$ increases significantly.

The responses described above lend themselves to several design factors. Firstly, by operating in the region in which $f_1<f_2<f_3$, both $f_{12}$ and $f_{23}$ are influenced by the inductor $L_2$ of the circuit shown in FIG. 1 and, thus, $L_2$ may be chosen to be the sample coil in a probe circuit having this basic configuration. Secondly, there is an inherent tradeoff between the influences of $f_2$ on $f_{12}$ and $f_{23}$. Increasing the shift on $f_{12}$ would decrease it for $f_{23}$, and vice versa. Therefore, a ratio of the shifts can be controlled by adjusting $f_2$. Finally, the resonant frequencies of the poles are largely dominated by adjacent zeroes, and are fairly independent of the remaining opposite zero. This implies that the poles can be independently tuned by varying $f_1$ and $f_3$ when operating in the region of FIG. 3 in which $f_1<f_2<f_3$.

Although the circuit of FIG. 1 is promising for the reasons provided above, the resonator $L_2C_2$ is not preferred as an NMR sample coil in the arrangement shown because the magnetic field distribution within $L_2$ would be unbalanced. This circuit is therefore modified to that shown in FIG. 4, in which admittance inverters $K_1$ and $K_3$ are used. By using this configuration, the input impedance is different as seen from Port 1 and Port 2. The influences of resonator $L_3C_3$ on pole $f_{12}$ and the influences of resonator $L_1C_1$ on pole $f_{23}$ are also reduced. Capacitors $C_{01}$ and $C_{02}$ are used, respectively, to match Port 1 at frequency $f_{12}$ only and to match Port 2 at frequency $f_{23}$ only.

Figure 4:
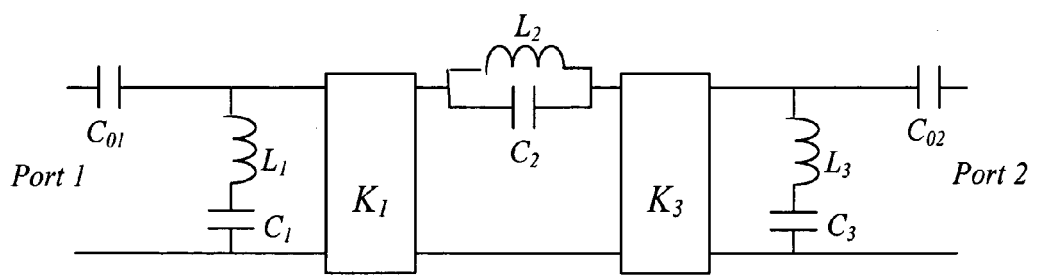
FIG. 4 is a schematic depiction of a probe circuit according to the present invention.
Figure 5:
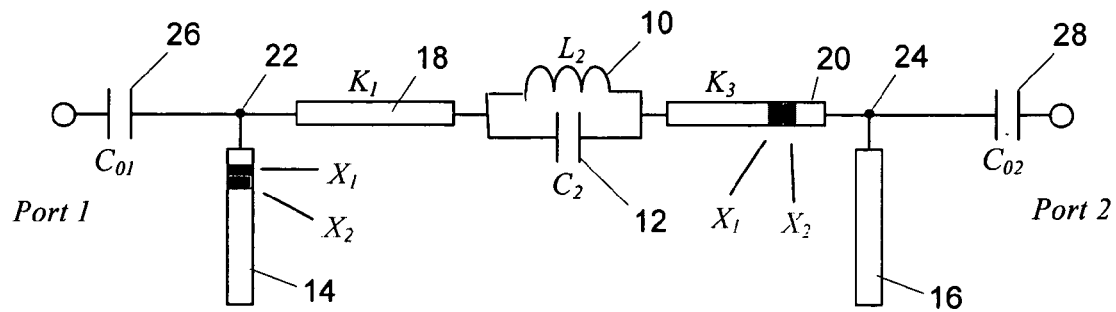
FIG. 5 is a graphical depiction of a circuit similar to that of FIG. 4 in which transmission lines are used for resonator and admittance inverter components.

Shown in FIG. 5 is a more practical embodiment of an NMR probe circuit having the characteristics of the circuit shown in FIG. 4. Sample coil 10 operates together with capacitor 12 as a resonator corresponding to the resonator $L_2C_2$ of FIG. 4. Resonator $L_1C_1$ is represented in FIG. 5 by transmission line 14. This transmission line segment is sized to be a quarter wavelength resonator at frequency $f_1$ with open termination. Similarly, resonator $L_3C_3$ is represented in FIG. 5 by transmission line 16, which is sized to be a quarter wavelength resonator at frequency $f_3$ with open termination. Admittance inverters 18 and 20 are also quarter wavelength resonators, and are at approximately the same length, preferably tuned to a frequency $f_K$ in the range $f_1<f_K<f_3$, for example $f_K \approx f_2$. With these quarter wavelength resonators positioned as indicated, the connection points 22 and 24 appear, respectively, to be short-circuit points to signals input at $f_1$ and $f_3$. Correspondingly, the presence of admittance inverters 18 and 20 transforms the open circuit (at frequency $f_2$) formed by the parallel connection of $L_2$ and $C_2$ into short circuit points at nodes 22 and 24. A matching capacitor 26 is used to match the impedance of Port 1 to external circuitry connected to it, while matching capacitor 28 is used to match the impedance of Port 2 to external circuitry connected to it.

In the arrangement shown in FIG. 5, two close resonant frequencies may be input to Port 1 and Port 2, respectively. Frequency $f_{12}$ may be input to Port 1, while frequency $f_{23}$ is input to Port 2. An example of two desirable resonances to be input at these points are the resonant frequency for $^{19}F$ (470.5 MHz), which could be input at Port 1, and the resonant frequency for $^1H$ (500.1 MHz), which could be input at Port 2. This arrangement of transmission line segments also lends itself to the input of a third resonant frequency. Because $f_{12}$ and $f_{23}$ are so close in frequency, "cold" or "null" points for these two frequencies exist in close physical proximity to each other on each of transmission line 14 and transmission line 20. These null points are indicated in FIG. 5 by the labels $X_1$ and $X_2$, where $X_1$ represents a null point for $f_{12}$ (e.g., $^{19}F$) and $X_2$ indicates a null point for $f_{23}$ (e.g., $^1H$). Because the null points $X_1$ and $X_2$ are so close to each other, a third resonant frequency may be input at this point, while still maintaining a high degree of relative isolation between the resonances. The relative location of these null points is not shown to scale in the figure and, in fact, the separation between them (for each of transmission line 14 and transmission line 20) is functionally negligible, since it is comparable to the width of the electrical conductor that might be connected at that point.

Since an additional resonant frequency could be connected at either of the null point pair locations, this probe circuit design allows for the addition of either one or two resonances in addition to frequencies $f_{12}$ and $f_{23}$. Thus, the probe may operate as an "HFXY" probe which, in conventional terms, refers to a probe that resonates at frequencies for each of $^1H$, $^{19}F$ and two additional elements ("X" and "Y"). These additional resonances are not close in frequency to $f_{12}$ and $f_{23}$, and may be, for example, $^{13}C$ and $^{15}N$. Thus, the probe of the present invention allows for good resonance performance with two close frequency resonances, including those at relatively high frequencies, and allows the input of one or two additional resonances with relative ease. It is also possible to connect additional ports close to, but not directly at, the null points, provided sufficient stop circuits are used to block the leakage of signal energy at other frequencies back into the added ports. Moreover, the transmission lines 18 and 16 could be made longer to the point that similar null points could be introduced to them, thereby creating additional potential input points. In the case of the resonator transmission line 16, the length of the transmission line would, of course, also have to satisfy the necessary dimensions for resonance at the frequency $f_3$. Those skilled in the art will also recognize that additional transmission lines could be added, all being interconnected to the existing transmission lines. This array of transmission lines could provide addition input points for additional resonant signals, but adds significantly to the size and complexity of the probe circuit.

The probe design described herein provides a number of advantages. Firstly, the channels for $f_{12}$ and $f_{23}$ are input from two different ports, so that a diplexer or splitter is not required. Secondly, these two channels use separate tuning and matching elements, allowing the channels to be matched to the required frequencies independently. Thirdly, the total efficiency is split between these two channels, and the efficiency split ratio can be easily controlled with capacitor $C_2$. Finally, the components necessary for this design can be mounted into a very small area, and fits easily into the space available in a standard magnet bore. In general, the probe circuit exhibits excellent balance and isolation properties in a small package.

Figure 6:
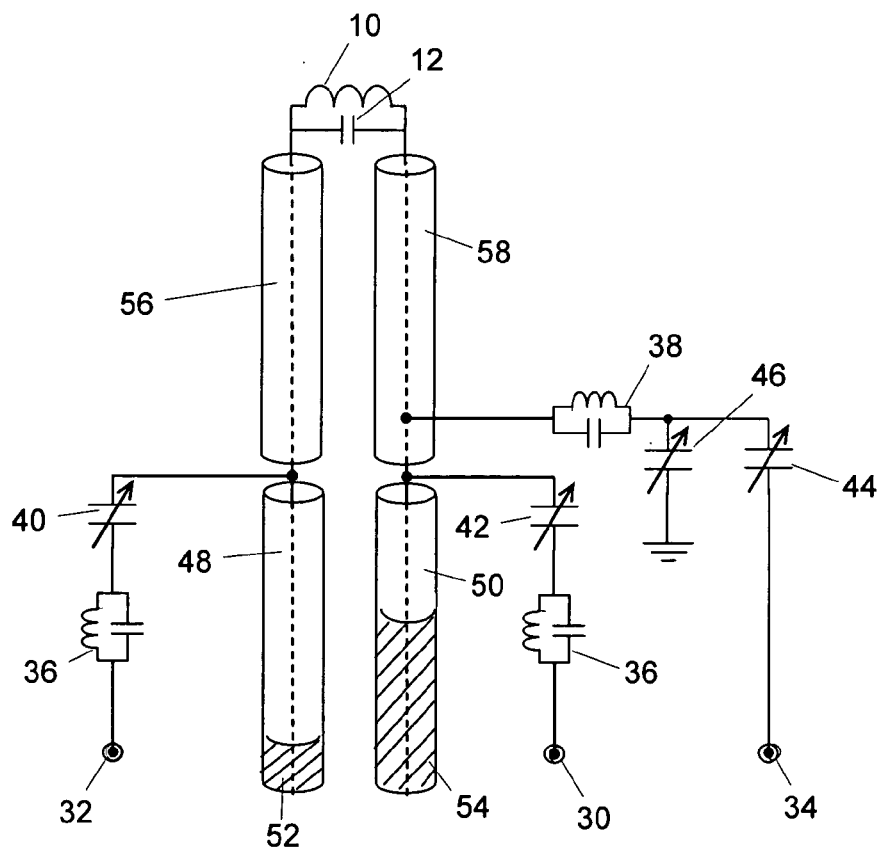
FIG. 6 is a graphical depiction of an example circuit following the design of the circuit of FIG. 4 with physical connections and tuning elements shown.

An example probe circuit is shown in FIG. 6. This probe has two high frequency resonances corresponding to $^1H$ and $^{19}F$, and an additional resonance corresponding to $^{13}C$. The $^1H$ resonance is input via port 30, the $^{19}F$ resonance is input via port 32, and the $^{13}C$ resonance is input via port 34. Each of ports 30 and 32 has a $^{13}C$ stop circuit 36 to prevent leakage of the $^{13}C$ resonant signal energy back through those ports, and port 34 has an optional $^1H/^{19}F$ stop circuit 38 that prevents any potential leakage of the $^1H$ and $^{19}F$ resonant signal energy back to that port. Also shown are matching capacitors 40, 42 and 44 which are located in the input paths for ports 32, 30 and 34, respectively. In addition, capacitor 46 is connected on one side to a point between stop circuit 38 and matching capacitor 44, and has its other terminal connected to ground. This capacitor is used to tune the resonant frequency of port 34 to that of $^{13}C$.

The example circuit shown in FIG. 6 is a 500 MHz HFC probe circuit for a 4 mm stator. The sample coil 10 has 8.5 turns and a 0.15 pF parallel capacitor 12. Transmission line 50 is a first quarter wavelength resonator used for tuning to the $^1H$ input at port 30. Similarly, transmission line 48 is a quarter wavelength resonator used for tuning the $^{19}F$ input at port 32. Fine tuning of each of these resonators is accomplished by adjusting the depth of penetration of inserts 54 and 52, respectively, which change the resonant characteristics. These inserts may be made out of a material such as TEFLON® (a registered trademark of E. I. du Pont de Nemours and company). Alternatively, it may be desirable to use a material other than TEFLON, which contains fluorine, and may result in a background signal. Thus, a material that contains no $^1H$, $^{19}F$ or $^{13}C$ would be appropriate.

The admittance inverters 56 and 58 are also transmission lines, as described above. The $^{13}C$ resonance signal is input to a point along the admittance inverter 58 which is in close proximity to the nulls for $^1H$ and $^{19}F$, as shown in FIG. 5. This signal input could also be connected to the transmission line 48 at a similar point relative to the nulls of the other signals. When using the appropriate stop circuit 38, it is also possible to input the signal somewhere in the vicinity of the null points of either transmission line 58 or transmission line 48, without actually being connected right to them, although being right at the null points is preferable. Moreover, it is also possible to make transmission lines 50 and 56 longer than necessary to introduce null points on those transmission lines as well, thereby creating additional potential input points. In the example circuit, the total efficiency of the probe is split between $^1H$ and $^{19}F$ signals. If desired, the ratio of the split can be controlled by varying the resonant frequency of the sample coil, which can be done by varying the inductance of the sample coil, or the capacitance of its parallel capacitor.

While the invention has been shown and described with reference to certain embodiments thereof, it will be recognized by those skilled in the art that various changes in form and detail may be made herein without departing from the spirit and scope of the invention as defined by the appended claims.

What is claimed is:

1. A nuclear magnetic resonance probe circuit comprising:
   a first resonator resonant at a frequency $f_1$;
   a second resonator having a magnetic field generating component and being resonant at a frequency $f_2$ that is higher than $f_1$; and
   a third resonator resonant at a frequency $f_3$ that is higher than $f_2$, wherein the resonances of the first, second and third resonators interact to produce two intermediate resonances, respectively, at a frequency $f_{12}$ between frequency $f_1$ and $f_2$, and a frequency $f_{23}$ between frequency $f_2$ and $f_3$ such that, when signals at $f_{12}$ and $f_{23}$ are coupled into the circuit, the circuit resonates at $f_{12}$ and $f_{23}$ and magnetic fields are generated by the magnetic field generating element at frequency $f_{12}$ and frequency $f_{23}$.

2. A probe circuit according to claim 1 wherein the magnetic field generating element comprises an inductive sample coil.

3. A probe circuit according to claim 1 wherein the first resonator comprises a transmission line.

4. A probe circuit according to claim 1 wherein each of the first resonator and the third resonator comprise a transmission line, respectively.

5. A probe circuit according to claim 4 wherein the first resonator is electrically adjacent to a first input port for frequency $f_{12}$ and the third resonator is electrically adjacent to a second input port for frequency $f_{23}$.

6. A probe circuit according to claim 5 further comprising a first admittance inverter located electrically between the first input port and a first electrical side of the second resonator.

7. A probe circuit according to claim 6 wherein the first admittance inverter comprises a transmission line.

8. A probe circuit according to claim 6 further comprising a second admittance inverter located electrically between the second input port and a second electrical side of the second resonator.

9. A probe circuit according to claim 8 wherein the second admittance inverter comprises a transmission line.

10. A probe circuit according to claim 9 wherein the first resonator transmission line has null points for frequencies $f_{12}$ and $f_{23}$ in close physical proximity to each other, and wherein the circuit further comprises a third input port for resonant frequency $f_x$ coupled to the first resonator transmission line in the vicinity of said null points such that, when a third input signal at frequency $f_x$ is coupled to the third input port, a magnetic field is generated by the magnetic field generating element at frequency $f_x$.

11. A probe circuit according to claim 9 wherein the second admittance inverter transmission line has null points for frequencies $f_{12}$ and $f_{23}$ in close physical proximity to each other, and wherein the circuit further comprises a third input port for resonant frequency $f_y$ coupled to the first resonator transmission line in the vicinity of said null points such that, when a third input signal at frequency $f_y$ is input to the third input port, a magnetic field is generated by the magnetic field generating element at frequency $f_y$.

12. A probe circuit according to claim 1 wherein $f_{12}$ and $f_{23}$ are each above 400 MHz.

13. A probe circuit according to claim 1 wherein $f_{12}$ and $f_{23}$ are within 10% of each other in frequency.

14. A nuclear magnetic resonance probe circuit for generating resonant magnetic fields at a first frequency $f_{12}$ and a second frequency $f_{23}$, the circuit comprising:
    a first resonator resonant at a frequency $f_1$ that is lower than $f_{12}$;
    a second resonator having a magnetic field generating component from which the resonant magnetic fields originate, the resonator being resonant at a frequency $f_2$ that is higher than $f_1$ and $f_{12}$, but lower than $f_{23}$; and
    a third resonator resonant at a frequency $f_3$ that is higher than $f_{23}$, wherein the first, second and third resonators are arranged in the circuit relative to one another such that they are in a parallel combination or in a combination that is the electrical equivalent of a parallel combination.

15. A probe circuit according to claim 14 wherein the magnetic field generating element comprises an inductive sample coil.

16. A probe circuit according to claim 14 wherein the first resonator comprises a transmission line.

17. A probe circuit according to claim 14 wherein each of the first resonator and the third resonator comprise a transmission line, respectively.

18. A probe circuit according to claim 17 wherein the first resonator is electrically adjacent to a first input port for frequency $f_{12}$ and the third resonator is electrically adjacent to a second input port for frequency $f_{23}$.

19. A probe circuit according to claim 18 further comprising a first admittance inverter located electrically between the first input port and a first electrical side of the second resonator.

20. A probe circuit according to claim 19 wherein the first admittance inverter comprises a transmission line.

21. A probe circuit according to claim 19 further comprising a second admittance inverter located electrically between the second input port and a second electrical side of the second resonator.

22. A probe circuit according to claim 21 wherein the second admittance inverter comprises a transmission line.

23. A probe circuit according to claim 22 wherein the first resonator transmission line has null points for frequencies $f_{12}$ and $f_{23}$ in close physical proximity to each other, and wherein the circuit further comprises a third input port for resonant frequency $f_x$ coupled to the first resonator transmission line in the vicinity of said null points such that, when a third input signal at frequency $f_x$ is coupled to the third input port, a magnetic field is generated by the magnetic field generating element at frequency $f_x$.

24. A probe circuit according to claim 22 wherein the second admittance inverter transmission line has null points for frequencies $f_{12}$ and $f_{23}$ in close physical proximity to each other, and wherein the circuit further comprises a third input port for resonant frequency $f_y$ coupled to the first resonator transmission line in the vicinity of said null points such that, when a third input signal at frequency $f_y$ is coupled to the third input port, a magnetic field is generated by the magnetic field generating element at frequency $f_y$.

25. A probe circuit according to claim 14 wherein $f_{12}$ and $f_{23}$ are each above 400 MHz.

26. A probe circuit according to claim 14 wherein $f_{12}$ and $f_{23}$ are within 10% of each other in frequency.

27. A method of generating a plurality of high frequency magnetic fields for a nuclear magnetic resonance probe, the method comprising:
    providing a probe circuit having a first resonator resonant at a frequency $f_1$, a second resonator that has a magnetic field generating component and is resonant at a frequency $f_2$ that is higher than $f_1$, and a third resonator resonant at a frequency $f_3$ that is higher than $f_2$, the resonances of the three resonators giving rise to intermediate resonances at frequency $f_{12}$, between frequencies $f_1$ and $f_2$, and frequency $f_{23}$, between frequencies $f_2$ and $f_3$; and coupling a first signal at frequency $f_{12}$ and a second signal at frequency $f_{23}$ to the circuit such that magnetic fields are generated by the magnetic field generating element at frequency $f_{12}$ and frequency $f_{23}$.

28. A method according to claim 27 wherein the magnetic field generating element comprises an inductive sample coil.

29. A method according to claim 27 wherein each of the first resonator and the third resonator comprise a transmission line, respectively.

30. A method according to claim 29 wherein the first resonator is electrically adjacent to a first input port for the first signal and the third resonator is electrically adjacent to a second input port for the second signal.

31. A method according to claim 30 further comprising locating a first admittance inverter electrically between the first input port and a first electrical side of the second resonator and a second admittance inverter electrically between the second input port and a second electrical side of the second resonator.

32. A method according to claim 31 wherein the first admittance inverter and the second admittance inverter each comprise a transmission line.

33. A method according to claim 32 wherein the first resonator transmission line has null points for frequencies $f_{12}$ and $f_{23}$ in close physical proximity to each other, and wherein the method further comprises coupling a third input signal at frequency $f_x$ to a third input port electrically connected to the first resonator transmission line in the vicinity of said null points such that, when a third input signal at frequency $f_x$ is coupled to the third input port, a magnetic field is generated by the magnetic field generating element at frequency $f_x$.

34. A method according to claim 32 wherein the second admittance inverter transmission line has null points for frequencies $f_{12}$ and $f_{23}$ in close physical proximity to each other, and wherein the method further comprises coupling a third input signal at frequency $f_y$ to a third input port electrically connected to the first resonator transmission line in the vicinity of said null points such that, when a third input signal at frequency $f_y$ is coupled to the third input port, a magnetic field is generated by the magnetic field generating element at frequency $f_y$.

35. A method according to claim 27 wherein $f_{12}$ and $f_{23}$ are each above 400 MHz.

36. A method according to claim 27 wherein $f_{12}$ and $f_{23}$ are within 10% of each other in frequency.

37. A method for generating resonant magnetic fields at a first frequency $f_{12}$ and a second frequency $f_{23}$ that is higher than $f_{12}$, the method comprising:

providing a nuclear magnetic resonance (NMR) probe circuit comprising a first resonator resonant at a frequency $f_1$ that is lower than $f_{12}$, a second resonator having a magnetic field generating component from which the resonant magnetic fields originate, the resonator being resonant at a frequency $f_2$ that is higher than $f_1$ and $f_{12}$, but lower than $f_{23}$, and third resonator resonant at a frequency $f_3$ that is higher than $f_{23}$, wherein the first, second and third resonators are arranged in the circuit relative to one another such that they are in a parallel combination or in a combination that is the electrical equivalent of a parallel combination; and coupling a first signal at frequency $f_{12}$ and a second signal at frequency $f_{23}$ to the circuit such that magnetic fields are generated by the magnetic field generating element at frequency $f_{12}$ and frequency $f_{23}$.

\* \* \* \* \*